United States Patent
Kwon et al.

(10) Patent No.: US 9,207,499 B2
(45) Date of Patent: Dec. 8, 2015

(54) DISPLAY SUBSTRATE, DISPLAY DEVICE INCLUDING THE SAME, AND METHOD OF MANUFACTURING THE DISPLAY SUBSTRATE COMPRISING FIRST AND SECOND COLUMN SPACERS THAT PROTRUDE FROM A BLACK MATRIX PATTERN

(71) Applicant: Samsung Display Co., Ltd., Yongin, Gyeonggi-Do (KR)

(72) Inventors: Se-Ah Kwon, Seoul (KR); Sang-Hun Lee, Suwon-si (KR); Gwan-Soo Kim, Asan-si (KR); Yui-Ku Lee, Asan-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/497,626

(22) Filed: Sep. 26, 2014

(65) Prior Publication Data

US 2015/0017869 A1 Jan. 15, 2015

Related U.S. Application Data

(62) Division of application No. 13/079,195, filed on Apr. 4, 2011, now Pat. No. 8,873,018.

(30) Foreign Application Priority Data

Aug. 10, 2010 (KR) ........................ 10-2010-0076912

(51) Int. Cl.
| | | |
|---|---|---|
| G02F 1/1339 | (2006.01) | |
| G02F 1/1333 | (2006.01) | |
| G02F 1/1335 | (2006.01) | |
| G03F 7/00 | (2006.01) | |
| G02F 1/1362 | (2006.01) | |

(52) U.S. Cl.
CPC .......... *G02F 1/13394* (2013.01); *G02F 1/1333* (2013.01); *G02F 1/133512* (2013.01); *G03F 7/0005* (2013.01); *G02F 2001/13396* (2013.01); *G02F 2001/136236* (2013.01)

(58) Field of Classification Search
CPC .................. G03F 7/0005; G02F 2001/136236; G02F 1/13394; G02F 1/1333; G02F 2001/13396
USPC ......................................... 349/110, 155–157
See application file for complete search history.

(56) References Cited

U.S. PATENT DOCUMENTS

| | | |
|---|---|---|
| 2005/0140858 A1* | 6/2005 | Park ............................ 349/110 |
| 2005/0275768 A1 | 12/2005 | Tsubata et al. |
| 2008/0068537 A1 | 3/2008 | Lee et al. |
| 2008/0106690 A1 | 5/2008 | Kuo et al. |
| 2009/0258451 A1 | 10/2009 | Kim et al. |

* cited by examiner

*Primary Examiner* — Paul Lee
(74) *Attorney, Agent, or Firm* — Cantor Colburn LLP (57) ABSTRACT

A display substrate includes a substrate on which a first pixel area including a first light-blocking region, and a second pixel area adjacent to the first pixel area and including a second light-blocking region are defined, an insulating layer in the first and second light-blocking regions, a black matrix pattern layer on the insulating layer, a first column spacer in the first light-blocking region and protruding from the black matrix pattern layer, and a second column spacer in the second light-blocking region and protruding from the black matrix pattern layer. A height of a top surface of the first column spacer is different from a height of a top surface of the second column spacer, where the heights are taken with respect to the substrate.

8 Claims, 8 Drawing Sheets

DISPLAY SUBSTRATE, DISPLAY DEVICE INCLUDING THE SAME, AND METHOD OF MANUFACTURING THE DISPLAY SUBSTRATE COMPRISING FIRST AND SECOND COLUMN SPACERS THAT PROTRUDE FROM A BLACK MATRIX PATTERN

This application is a divisional application of U.S. application Ser. No. 13/079,195 filed Apr. 4, 2011, which claims priority to Korean Patent Application No. 10-2010-0076912 filed on Aug. 10, 2010, and all the benefits accruing therefrom under 35 U.S.C. §119, the disclosure of which is incorporated herein by reference in its entirety.

BACKGROUND OF THE INVENTION

1. Field of the Invention

The invention relates to a display substrate, a display device, and a method of manufacturing the display substrate.

2. Description of the Related Art

Electronic display devices play an increasingly important role in today's information society, and various kinds of electronic display devices are widely used in diverse industrial fields. As semiconductor technology makes great strides, solidification of various electronic devices with low driving voltage, low power consumption, light weight and compact size has been achieved. In this regard, there is required to fabricate a slimmer and lighter flat panel display device having low driving voltage and low power consumption adapted for new industrial environment.

BRIEF SUMMARY OF THE INVENTION

The invention provides a display substrate which has increased aperture ratio and transmittance and includes black matrices and column spacers formed simultaneously.

The invention also provides a display device including a display substrate which has increased aperture ratio and transmittance and includes black matrices and column spacers formed simultaneously.

The invention also provide a method of manufacturing a display substrate, in which the aperture ratio and transmittance of the display substrate are increased, and black matrices and column spacers are formed simultaneously.

However, the invention are not restricted to the embodiments set forth herein. The above and other features of the invention will become more apparent to one of ordinary skill in the art to which the invention pertains by referencing the detailed description of the invention given below.

In an exemplary embodiment of the invention, there is provided a display substrate including a substrate on which a first pixel area including a first light-blocking region, and a second pixel area adjacent to the first pixel area and including a second light-blocking region are defined, an insulating layer in the first and second light-blocking regions, a black matrix pattern layer on the insulating layer, a first column spacer in the first light-blocking region and which protrudes from the black matrix pattern layer, and a second column spacer in the second light-blocking region and which protrudes from the black matrix pattern layer. A height of a top surface of the first column spacer is different from a height of a top surface of the second column spacer, the heights taken with respect to a common reference point.

In another exemplary embodiment of the invention, there is provided a display device including a first display substrate, a second display substrate which faces the first display substrate, and a liquid crystal layer which is interposed between the first display substrate and the second display substrate. The first display substrate includes a substrate on which a first pixel area including a first light-blocking region, and a second pixel area adjacent to the first pixel area and including a second light-blocking region are defined, an insulating layer in the first and second light-blocking regions, a black matrix pattern layer on the insulating layer, a first column spacer in the first light-blocking region and which protrudes from the black matrix pattern layer, and a second column spacer in the second light-blocking region and which protrudes from the black matrix pattern layer. A height of a top surface of the first column spacer is different from a height of a top surface of the second column spacer, the heights taken with respect to a common reference point.

In another exemplary embodiment of the invention, there is provided a method of manufacturing a display substrate. The method includes providing a substrate on which a first pixel area including a first light-blocking region, and a second pixel area adjacent to the first pixel area and including a second light-blocking region are defined, forming an insulating layer in the first and second light-blocking regions, forming a black matrix pattern layer on the insulating layer, forming a first column spacer in the first light-blocking region and which protrudes from the black matrix pattern layer, and forming a second column spacer in the second light-blocking region and which protrudes from the black matrix pattern layer. A height of a top surface of the first column spacer is different from a height of a top surface of the second column spacer, the heights taken with respect to a common reference point.

BRIEF DESCRIPTION OF THE DRAWINGS

The above and other features of the invention will become more apparent by describing in detail exemplary embodiments thereof with reference to the attached drawings, in which:

FIGS. 9A through 10 are cross-sectional views sequentially illustrating processes included in the method of manufacturing a display substrate of FIG. 8.

DETAILED DESCRIPTION OF THE INVENTION

Advantages and features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Hereinafter, exemplary embodiments of a display substrate, a display device including the same, and a method of manufacturing the display substrate according to the invention will be described with reference to the attached drawings.

Figure 1:
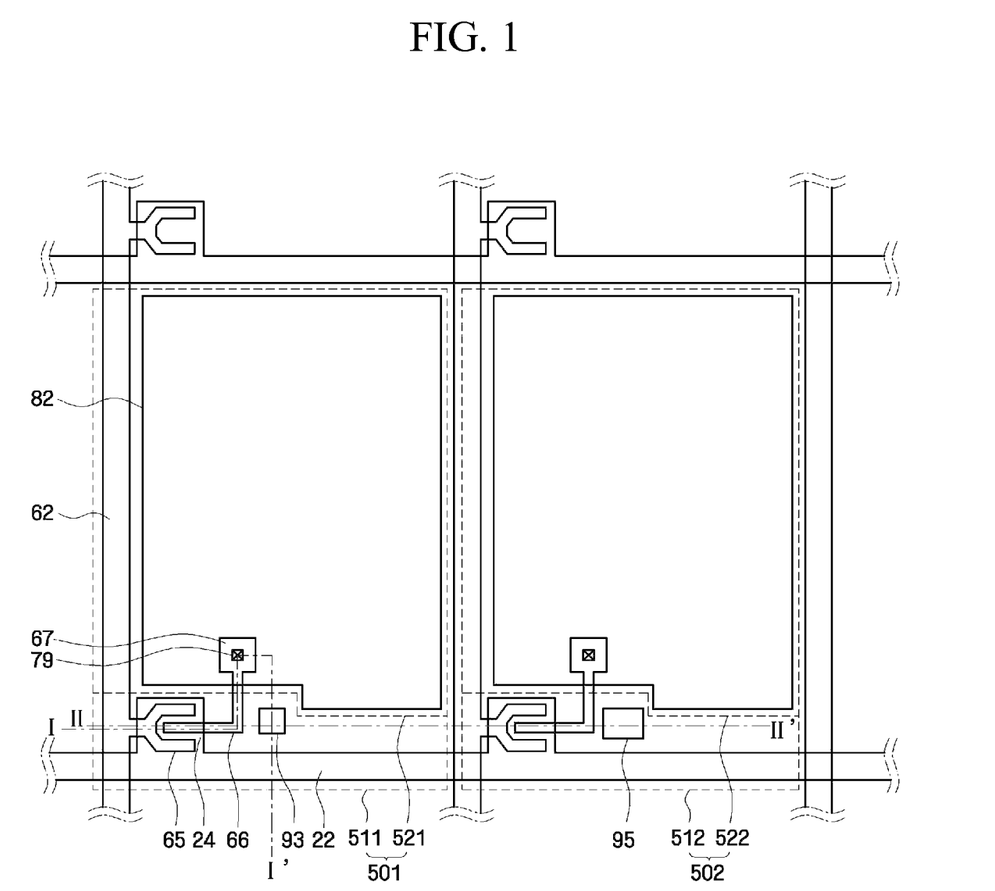
FIG. 1 is a plan view of an exemplary embodiment of a display substrate, according to the invention.
Figure 2:
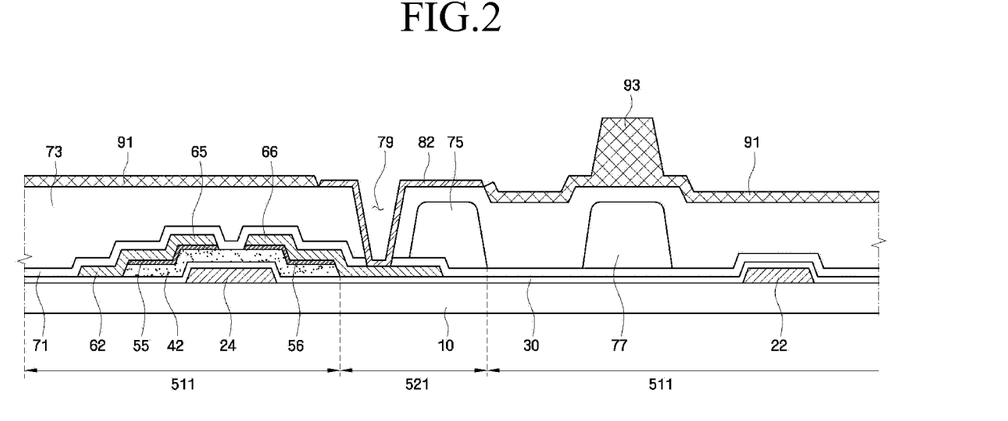
FIG. 2 is a cross-sectional view of the display substrate taken along line I-I' of FIG. 1.
Figure 3:
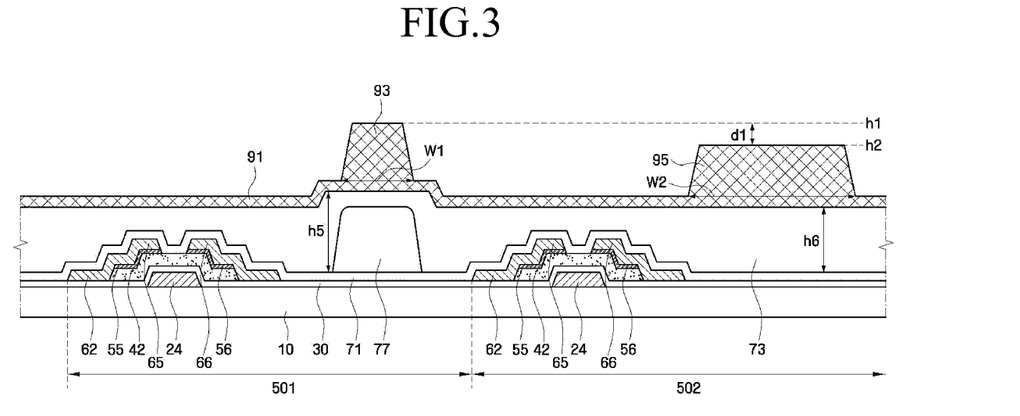
FIG. 3 is a cross-sectional view of the display substrate taken along line II-II' of FIG. 1.

First, an exemplary embodiment of a display substrate according to the invention will be described with reference to FIGS. 1 through 3. FIG. 1 is a plan view of the exemplary embodiment of a display substrate according to the invention. FIG. 2 is a cross-sectional view of the display substrate taken along line I-I' of FIG. 1. FIG. 3 is a cross-sectional view of the display substrate taken along line II-II' of FIG. 1.

Referring to FIGS. 1 and 2, a first pixel area 501, and a second pixel area 502 which neighbors the first pixel area 501 are defined in a substrate 10 included in the display substrate. The first pixel area 501 includes a first light-blocking region 511 and a first pixel region 521, and the second pixel area 502 includes a second light-blocking region 512 and a second pixel region 522. Here, the first and second light-blocking regions 511 and 512 can be understood as regions that prevent light, which is emitted from a light source (not shown) of a backlight assembly (not shown) disposed under the display substrate, from passing through the display substrate towards a viewing side of the display substrate. In addition, the first and second pixel regions 521 and 522 can be understood as regions through which light emitted from the light source of the backlight assembly passes.

The substrate 10 may include glass, such as soda lime glass or boro silicate glass, or plastic.

A gate wiring which delivers a gate signal is on the substrate 10. The gate wiring includes a gate line 22 which longitudinally extends in a first direction, e.g., a horizontal direction in the plan view, and a gate electrode 24 which protrudes from the gate line 22 and is included in a thin-film transistor ("TFT"). The gate electrode 24 constitutes three terminals of the TFT, together with a source electrode 65 and a drain electrode 66, which will be described later. The gate line 22 including the gate electrode 24, is a single unitary and indivisible element.

A storage wiring (not shown) may be on the substrate 10 to be longitudinally extended substantially parallel to the gate wiring. That is, the storage wiring may include a storage line which extends in the first direction (e.g., the horizontal direction), and a storage electrode which branches and protrudes from the storage line in a second direction (e.g., a vertical direction). The storage wiring may be under a data line 62, for example, between the data line 62 and the substrate 10. The storage electrode may be wider than the data line 62 in the plan view, thereby reducing or effectively preventing leakage of light around the data line 62. Accordingly, the storage electrode may function as a light-blocking film.

A predetermined voltage, e.g., a common voltage Vcom, is applied to the storage wiring. The storage electrode and a pixel electrode 82 overlap each other, and a gate insulating layer 30 is interposed, as a dielectric layer, between the storage electrode and the pixel electrode 82, thereby forming a storage capacitor.

The gate wiring (e.g., the gate line 22 and the gate electrode 24) and the storage wiring may include, but is not limited to, aluminum (Al)-based metal such as Al or an Al alloy (e.g., Al, AlNd, AlCu, etc.), silver (Ag)-based metal such as Ag or an Ag alloy, copper (Cu)-based metal such as Cu or a Cu alloy, molybdenum (Mo)-based metal such as Mo or a Mo alloy (e.g., Mo, MoN, MoNb, etc.), chrome (Cr), titanium (Ti), or tantalum (Ta).

In addition, the gate wiring and the storage wiring may have a multi-layer structure in a third direction orthogonal to both the first and second directions, including two conductive films (not shown) with different physical characteristics. In this case, one of the two conductive films may include metal with low resistivity, such as Al-based metal, Ag-based metal or Cu-based metal, in order to reduce a signal delay or a voltage drop of the gate wiring and the storage wiring. The other one of the two conductive films may include a different material, in particular, a material having superior contact characteristics with indium tin oxide ("ITO") and indium zinc oxide ("IZO"), such as Mo-based metal, Cr, Ti, or Ta. Exemplary embodiments of the multi-layer structure include a combination of a Cr lower film and an Al upper film, and a combination of an Al lower film and a Mo upper film. However, the invention is not limited thereto. The gate wiring and the storage wiring may include various metals and conductors.

The gate insulating layer 30 is directly on and contacting the gate wiring, the storage wiring, and a portion of the substrate 10 on which the gate wiring and the storage wiring are not disposed. The gate insulating layer 30 may include an inorganic insulating material such as silicon oxide (SiOx) or silicon nitride (SiNx), or may include an organic insulating material such as benzocyclobutene ("BCB"), an acrylic material, or polyimide. The gate insulating layer 30 covers (e.g., overlaps) the gate wiring and the storage wiring, such as an entire of upper and/or side surfaces of the gate wiring and the storage wiring.

A semiconductor layer 42 is on the gate insulating layer 30. The semiconductor layer 42 is directly on the gate insulating layer 30 to correspond to the gate electrode 24. As used herein, "correspond" indicates substantially the same or aligned in dimension, quantity or positional placement relative to another element. The semiconductor layer 42 may include amorphous silicon (a-Si). Alternatively, the semiconductor layer 42 may include an oxide semiconductor including at least one element selected from gallium (Ga), indium (In), tin (Sn), and zinc (Zn). The oxide semiconductor may be additionally doped with other metal elements. In one exemplary embodiment, for example, the semiconductor layer 42 may include an oxide semiconductor such as GaInZnO including Ga, In and Zn, or HfInZnO including hafnium (Hf), In and Zn. Alternatively, the semiconductor layer 42 may include InSnO including In and Sn, SnZnO including Sn and Zn, or InSnO or SnZnO doped with another metal element.

Ohmic contact layers 55 and 56 are directly on the semiconductor layer 42. The ohmic contact layers 55 and 56 can improve contact characteristics between the source electrode 65 and the semiconductor layer 42, and the drain electrode 66 and the semiconductor layer 42, which will be described later. Here, the ohmic contact layers 55 and 56 may include a-Si heavily doped with n+ impurities. If sufficient contact characteristics can be secured between the source and drain electrodes 65 and 66 and the semiconductor layer 42, respectively, the ohmic contact layers 55 and 56 may be omitted.

A data wiring is directly on the ohmic contact layers 55 and 56 and the gate insulating layer 30. The data wiring includes the data line 62, the source electrode 65, the drain electrode 66, and a drain electrode extension portion 67. The data line 62 longitudinally extends in the second direction, e.g., in the vertical direction, and intersects the gate line 22 to define a pixel. The source electrode 65 branches directly from the data line 62 and extends to overlap the semiconductor layer 42 in the plan view. The data line 62 including the source electrode 65 is a single unitary indivisible element.

The drain electrode 66 is separated from the source electrode 65 and is overlaps the semiconductor layer 42 to face the source electrode 65 with respect to the gate electrode 24, or a channel region, of the TFT. The drain electrode extension portion 67 extends from the drain electrode 66 and has a relatively wide area, for example, in the second direction, compared to a width of the drain electrode 66. The drain electrode extension portion 67 improves an electrical contact between the drain electrode 66 and the pixel electrode 82 which will be described later.

The data wiring (e.g., the data line 62, the source and drain electrodes 65 and 66, and the drain electrode extension portion 67) may directly contact the semiconductor layer 42 or the ohmic contact layers 55 and 56, to form an ohmic contact. To form the ohmic contact, the data wiring may have a single-layer or multi-layer structure including, but not limited to a material or materials selected from Ni, Co, Ti, Ag, Cu, Mo, Al, Be, Nb, Au, Fe, Se, Mn, and Ta. Exemplary embodiments of the multi-layer structure include a double film such as Ta/Al, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd, Mo/Nb, or Mn (Mn alloy)/Cu, and a triple film such as Ti/Al/Ti, Ta/Al/Ta, Ti/Al/TiN, Ta/Al/TaN, Ni/Al/Ni or Co/Al/Co. The material of the data wiring is not limited to the above materials.

A passivation film 71 is directly on the data wiring and the semiconductor layer 42. The passivation film 71 may include, but is not limited to, an inorganic material, such as SiNx or SiOx, or a low-k value insulating material formed by plasma enhanced chemical vapor deposition ("PECVD"), such as a-Si:C:O or a-Si:O:F.

Referring to FIG. 2, a color filter pattern 75 is in the first pixel area 501. A color filter pattern that can display a color is also in the second pixel area 502. However, it is understood for simplicity that the color filter pattern 75 is only in the first pixel area 501.

The color filter pattern 75 passes light in a predetermined wavelength range only, so that the first pixel area 501 can display a predetermined color. That is, the color filter pattern 75 may include a red pigment which passes light of a red wavelength, a green pigment which passes light of a green wavelength, and a blue pigment which passes light of a blue wavelength. The color filter pattern 75 may cover or be disposed in substantially an entire planar area of the first pixel region 521 of the first pixel area 501.

The color filter pattern 75 may include a photosensitive organic material such as a photoresist. Specifically, a photoresist in the color filter pattern 75 according to the illustrated exemplary embodiment may be a negative photoresist in which a portion of the photoresist that is exposed to light cures, or a positive photoresist in which a portion of the photoresist that is not exposed to light cures.

A step pattern 77 is in the first light-blocking region 511 of the first pixel area 501. The step pattern 77 is separated from the color filter pattern 75 by a predetermined gap in the plan view, and neighbors (e.g., is adjacent to) the TFT. The step pattern 77 may be an island-shaped pattern that is separated from the color filter pattern 75. The step pattern 77 may include substantially the same material as the color filter pattern 75. That is, the step pattern 77 may include a negative or positive photoresist, and/or a blue, green or red pigment.

The step pattern 77 may cause first and second column spacers 93 and 95, which will be described later, to have a predetermined step difference d1 (see FIG. 3) therebetween. To this end, the step pattern 77 may be in any one of the first light-blocking region 511 and the second light-blocking region 512. Accordingly, an insulating layer 73 in the first light-blocking region 511 and the second light-blocking region 512 may have a step in an area overlapping the step pattern 77. In addition, the first and second column spacers 93 and 95 on the insulating layer 73 may have the step difference d1 due to the step pattern 77 aligned with the first column spacer 93.

The insulating layer 73 is directly on and contacting the passivation film 71, the color filter pattern 75, and the step pattern 77. Here, the insulating layer 73 may cover (e.g., overlap) an entire surface (area) of the first and second pixel areas 501 and 502. That is, the insulating layer 73 is in the first pixel region 521 and the first light-blocking region 511 of the first pixel area 501, and in the second pixel region 522 and the second light-blocking region 512 of the second pixel area 502. The insulating layer 73 may include an organic material having photosensitivity and superior planarization characteristics. That is, the insulating layer 73 may include, but is not limited to, a positive or negative photoresist.

A height h5 of a top surface of a portion of the insulating layer 73 which overlaps the step pattern 77 disposed thereunder, taken from an upper surface of the passivation film 71, is greater than a height h6 of a top surface of a portion of the insulating layer 73, taken from the upper surface of the passivation film 71, under which the step pattern 77 is not disposed.

That is, when the step pattern 77 is in the first light-blocking region 511, the height h5 of the top surface of the portion of the insulating layer 73 which overlaps the step pattern 77 is greater than the height h6 of the top surface of the portion of the insulating layer 73 under which there is no step pattern 77. Accordingly, the top surface of the insulating layer 73 disposed in the first light-blocking layer 511 and the second light-blocking region 512 has a step difference.

A black matrix pattern layer 91 is directly on the insulating layer 73. The black matrix pattern layer 91 is in the first light-blocking region 511 of the first pixel area 501, and in the second light-blocking region 512 of the second pixel area 502. The black matrix pattern layer 91 may overlap the data wiring (e.g., the data line 62, the source and drain electrodes 65 and 66, and the drain electrode extension portion 67), and may overlap the gate wiring (e.g., the gate line 22 and the gate electrode 24).

The black matrix pattern layer 91 may include a negative or positive photoresist and a black pigment. The black matrix pattern layer 91 prevents light, which is emitted from the light source (not shown) disposed under the display substrate, from passing through the display substrate. Furthermore, the black matrix pattern layer 91 prevents external light from entering the first and second pixel areas 501 and 502.

The first and second column spacers 93 and 95 are directly on and contacting the black matrix pattern layer 91. Specifically, the first and second column spacers 93 and 95 protrude from the black matrix pattern layer 91. For ease of description, it is understood that the first column spacer 93 protrudes from the black matrix pattern layer 91 in the first light-blocking region 511, and that the second column spacer 95 protrudes from the black matrix pattern layer 91 in the second light-blocking region 512.

The first column spacer 93 may overlap the step pattern 77 in the plan view, and may be disposed on the insulating layer 73, such that the insulating layer 73 is between the first column spacer 92 and the step pattern 77. That is, the first column spacer 93 may be disposed on the top surface of the portion of the insulating layer 73 which overlaps the step pattern 77. The second column spacer 95 may be disposed on the top surface of the portion of the insulating layer 73 which does not overlap the step pattern 77. Accordingly, a height h1 of a top surface of the first column spacer 93 is greater than a height h2 of a top surface of the second column spacer 95, taken from a same reference point such as an upper surface of the substrate 10.

Here, the step difference d1 between the first column spacer 93 and the second column spacer 95 may be substantially equal to the step difference between the top surface of the portion of the insulating layer 73 which overlaps the step pattern 77 and the top surface of the portion of the insulating layer 73 which does not overlap the step pattern 77. That is, even if the first column spacer 93 and the second column spacer 95 have a same height (e.g., vertical length) taken from the top surface of the insulating layer 73, respectively, the step difference d1 may be created between the first column spacer 93 and the second column spacer 95 due to the step pattern 77 under the insulating layer 73. The step difference d1 between the first column spacer 93 and the second column spacer 95 may be about 0.5 micrometer (μm) to about 0.7 micrometer (μm), which will be described later.

The first column spacer 93 may contact a second display substrate 200 (see FIG. 6) included in a display device, which will be described later. That is, the first column spacer 93 maintains a constant distance between a first display substrate 100 (see FIG. 6) and the second display substrate 200 included in the display device. Here, the first display substrate 100 is substantially the same as the display substrate according to the exemplary embodiment in FIGS. 1-3 of the invention. The first column spacer 93 may have elasticity. Thus, it can be compressed by an external force and then return to its original state.

Figure 6:
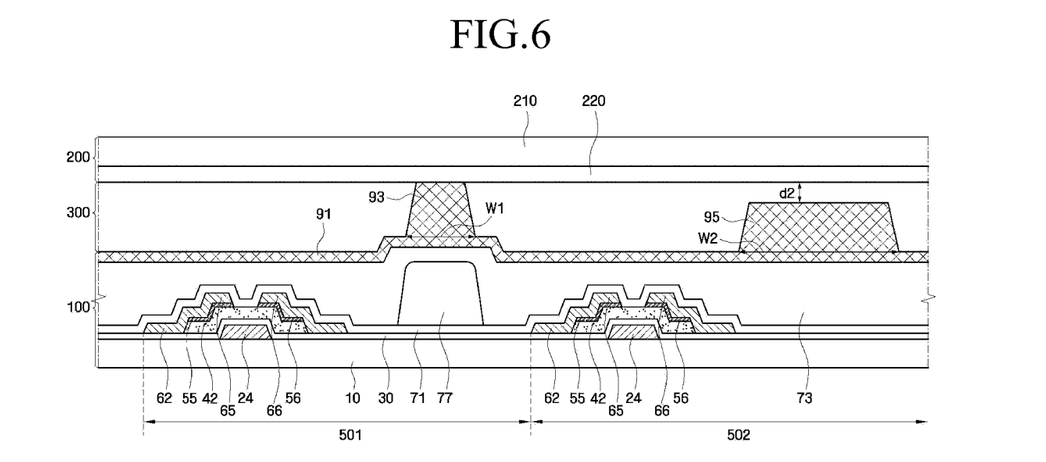
FIG. 6 is a cross-sectional view of another exemplary embodiment of a display device, according to the invention.

The second column spacer 95 is separated from the second display substrate 200 which will be described later. When an external force exceeding a predetermined value is applied to the first column spacer 93, the second column spacer 95 may come into contact with the second display substrate 200, thereby dispersing the external force applied to the first column spacer 93. Accordingly, the second column spacer 95 can reduce or effectively prevent damage to the first column spacer 93 by the external force. To disperse the external force more effectively, the second column spacer 95 may have a greater width W2 than a width W1 of the first column spacer 93, where the widths are taken parallel to the substrate 10, such as in the first and/or second directions. In one exemplary embodiment, for example, the width W2 of the second column spacer 95 that is parallel to the direction in which the gate wiring e.g., the gate line 22 and the gate electrode 24) extends may be greater than the width W1 of the first column spacer 93 in the same direction.

The first and second column spacers 93 and 95 which protrude from the black matrix pattern layer 91 may include substantially the same material as the black matrix pattern layer 91. In one exemplary embodiment, for example, the first and second column spacers 93 and 95 may include a negative or positive photoresist and a black pigment. As shown in FIG. 2, where there is no line between the first column spacer 93 and the black matrix pattern layer 91, the first and/or second column spacers 93 and 95, taken collectively with the black matrix pattern layer 91, form a single unitary indivisible element.

The pixel electrode 82 is directly on the insulating layer 73 in the first and second pixel regions 521 and 522. The pixel electrode 82 is electrically connected to the drain electrode extension portion 67 through a contact hole 79. Here, the pixel electrode 82 may include a transparent conductor such as ITO or IZO or a reflective conductor such as aluminum.

Figure 4:
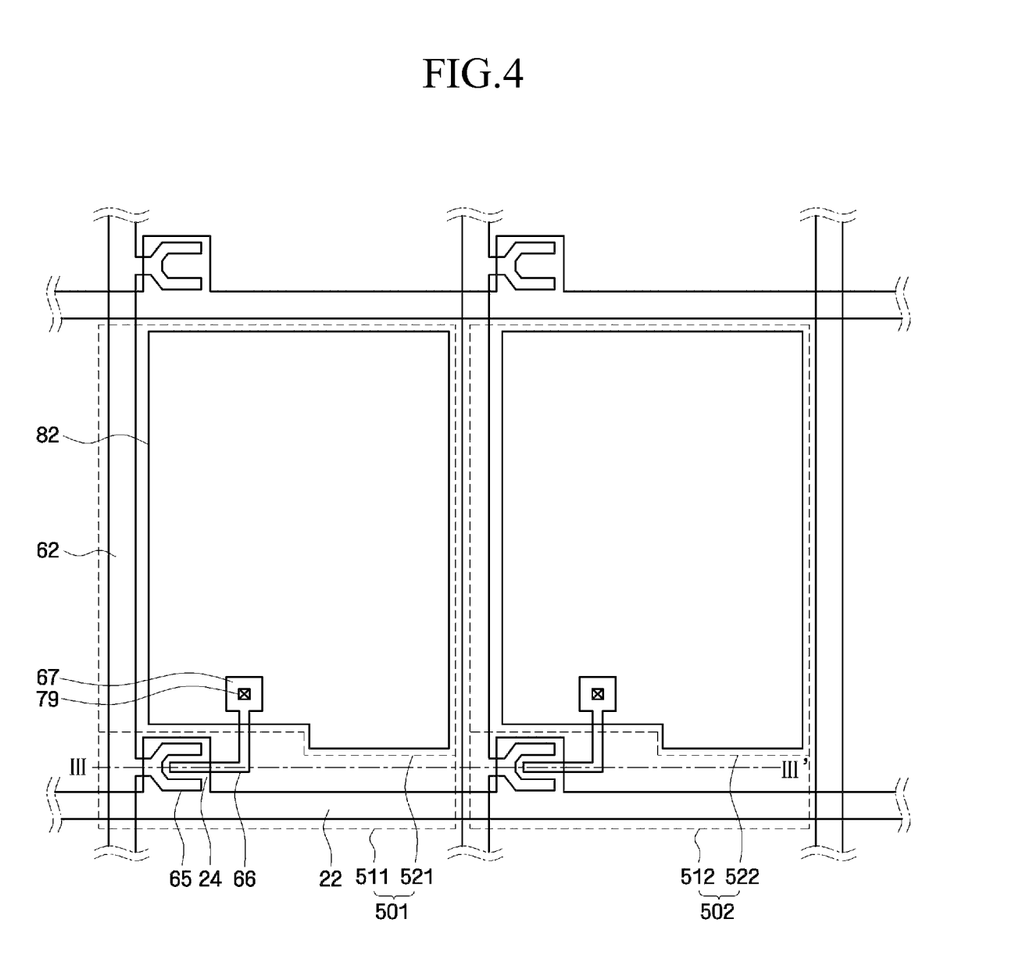
FIG. 4 is a plan view of another exemplary embodiment of a display substrate, according to the invention.
Figure 5:
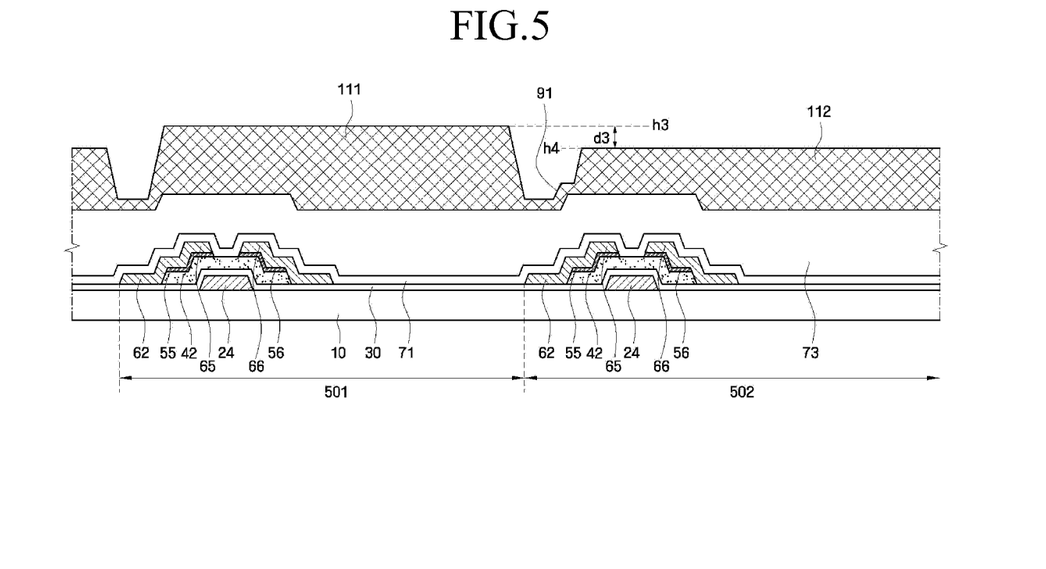
FIG. 5 is a cross-sectional view of the display substrate taken along III-III' line of FIG. 4.

Hereinafter, a display substrate according to another exemplary embodiment (hereinafter, referred to as a 'modified embodiment') of the above-described exemplary embodiment will be described with reference to FIGS. 4 and 5. FIG. 4 is a plan view of an exemplary embodiment of a display substrate according to the modified embodiment of the invention, and FIG. 5 is a cross-sectional view of the display substrate taken along line III-III' of FIG. 4. For simplicity, elements having the same functions as those illustrated in the drawings of the first exemplary embodiment are indicated by like reference numerals, and thus their description will be omitted.

Referring to FIGS. 4 and 5, a first pixel area 501 and a second pixel area 502 which neighbors the first pixel area 501 are defined in a substrate 10 included in the display substrate. The first pixel area 501 includes a first light-blocking region 511 and a first pixel region 521, and the second pixel area 502 includes a second light-blocking region 512 and a second pixel region 522.

The display substrate according to the modified embodiment includes a first column spacer 111 in the first light-blocking region 511, and a second column spacer 112 in the second light-blocking region 512.

The first column spacer 111 protrudes directly from a black matrix pattern layer in the first light-blocking region 511. In addition, the second column spacer 112 protrudes directly from the black matrix pattern in the second light-blocking region 512. Together, the first column spacer 111, the second column spacer 112 and the black matrix pattern layer form a single unitary indivisible element, as shown by the continuous element in FIG. 5.

A width of the first column spacer 111 may be substantially equal to a width of the first pixel area 501, the widths taken parallel to a direction in which a gate wiring (e.g., a gate line 22 and a gate electrode 24) extends. That is, the first column spacer 111 is not a discrete or individual feature within a particular portion of the first light-blocking region 511, but in and overlapping substantially an entire planar area of the first light-blocking region 511.

In addition, a width of the second column spacer 112 may be substantially equal to a width of the second pixel area 502, the widths taken parallel to the direction in which the gate wiring extends. That is, the second column spacer 112 is not a discrete or individual feature within a particular portion of the second light-blocking region 512, but is in and overlapping substantially an entire planar area of the second light-blocking region 512.

A height h3 of a top surface of the first column spacer 111 may be greater than a height h4 of a top surface of the second column spacer 112, where the heights are taken from a common reference point such as the substrate 10. Here, a step difference d3 between the first column spacer 111 and the second column spacer 112 may be about 0.5 μm to about 0.7 μm. This will be described later. Since the top surface of the first column spacer 111 is higher than the top surface of the second column spacer 112, the first column spacer 111 may contact the second display substrate 200 (see FIG. 6) which will be described later. That is, the first column spacer 111 maintains a constant distance between the first display substrate 100 (see FIG. 6) and the second display substrate 200. The first column spacer 111 may have elasticity. Thus, it can be compressed by an external force and then return to its original state.

The second column spacer 112 is separated from the second display substrate 200 which will be described later. When an external force exceeding a predetermined value is applied to the first column spacer 111, the second column spacer 112 may come into contact with the second display substrate 200, thereby dispersing the external force applied to the first column spacer 111. Accordingly, the second column spacer 112 can reduce or effectively prevent damage to the first column spacer 111 by the external force.

The first and second column spacers 111 and 112 which protrude from the black matrix pattern layer may include substantially the same material as the black matrix pattern layer. In one exemplary embodiment, for example, the first and second column spacers 111 and 112 may include a negative or positive photoresist and a black pigment. As shown in FIG. 5, where there is no line between the first column spacer 111 and the second column spacer 112, and the black matrix pattern layer 91, respectively, the first and/or second column spacers 111 and 112, taken collectively with the black matrix pattern layer 91, form a single unitary indivisible element.

The first pixel area 501 including the first column spacer 111 may display any one of blue, green and red colors. In addition, the second pixel area 502 including the second column spacer 112 may display any one of the blue, green and red colors. Here, the first pixel area 501 and the second pixel area 502 may display different colors. In one exemplary embodiment, for example, when the first pixel area 501 displays the blue color, the second pixel area 502 may display the green or red color, or vice versa.

Hereinafter, a display device according to another exemplary embodiment of the invention will be described with reference to FIG. 6. FIG. 6 is a cross-sectional view of another exemplary embodiment of a display device according to the invention. For simplicity, elements having the same functions as those illustrated in the drawings of the first exemplary embodiment are indicated by like reference numerals, and thus their description will be omitted.

Referring to FIG. 6, the display device may include the first display substrate 100, the second display substrate 200, and a liquid crystal layer 300. Here, the first display substrate 100 is substantially the same as the display substrate according to the exemplary embodiment in FIGS. 1-3, and thus a redundant description thereof will be omitted.

The second display substrate 200 may include an insulating substrate 210 and a common electrode 220 on the insulating substrate 210. Here, the common electrode 220 may include a transparent conductive material such as ITO or IZO.

The liquid crystal layer 300 is interposed between the first display substrate 100 and the second display substrate 200. The transmittance of the liquid crystal layer 300 is adjusted by a voltage difference between the pixel electrode 82 and the common electrode 220.

As described above, the first display substrate 100 includes first and second column spacers 93 and 95 having top surfaces at different heights. When the two different column spacers 93 and 95 are used, a greater liquid crystal margin can be secured than when a single column spacer is used. Accordingly, active unfilled area ("AUA") defects characterized by light leakage resulting from an insufficient amount of liquid crystals in a certain area can be reduced or effectively prevented. Furthermore, gravity defects caused by an excessive amount of liquid crystals in the direction of gravity can be reduced or effectively prevented.

The first column spacer 93 contacts the second display substrate 200, and the second column spacer 95 is separated from the second display substrate 200 by a predetermined gap d2. Here, the gap d2 between the second column spacer 95 and the second display substrate 200 may be substantially equal to the step difference d1 (see FIG. 3) between the first column spacer 93 and the second column spacer 95. Accordingly, the gap d2 between the second column spacer 95 and the second display substrate 200 may be about 0.5 µm to about 0.7 µm. When the gap d2 between the second column spacer 95 and the second display substrate 200 is less than about 0.5 µm, a sufficient liquid crystal margin cannot be secured, easily causing the above-described AUA defects. On the other hand, when the gap d2 between the second column spacer 95 and the second display substrate 200 is greater than about 0.7 µm, an external force applied to the first column spacer 93 cannot be dispersed, causing the damage to the first column spacer 93.

Figure 7:
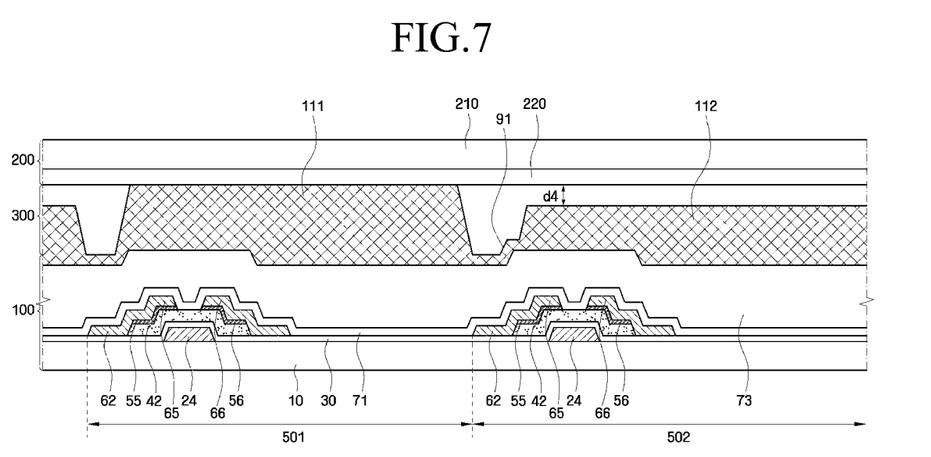
FIG. 7 is a cross-sectional view of another exemplary embodiment of a display device, according to the invention.

Hereinafter, a display device according to another exemplary embodiment (hereinafter, referred to as an 'alternative modified embodiment') of the embodiment in FIG. 6 will be described with reference to FIG. 7. FIG. 7 is a cross-sectional view of another exemplary embodiment of a display device according to the alternative modified embodiment of the invention. For simplicity, elements having the same functions as those illustrated in the drawings of the embodiments of FIGS. 4-6 are indicated by like reference numerals, and thus their description will be omitted.

Referring to FIG. 7, the display device may include the first display substrate 100, the second display substrate 200, and the liquid crystal layer 300. Here, the second display substrate 200 and the liquid crystal layer 300 are substantially the same as the second display substrate 200 and the liquid crystal layer 300 of FIG. 6 and thus a redundant description thereof will be omitted. In addition, the first display substrate 100 is the same as the first display substrate 100 of FIGS. 4 and 5, and thus a redundant description thereof will be omitted.

A first column spacer 111 included in the first display substrate 100 is in contact with the second display substrate 200, and a second column spacer 112 is separated from the second display substrate 200 by a predetermined gap d4. Here, the gap d4 between the second column spacer 112 and the second display substrate 200 may be substantially equal to the step difference d3 (see FIG. 5) between the first column spacer 111 and the second column spacer 112. Accordingly, the gap d4 between the second column spacer 112 and the second display substrate 200 may be about 0.5 µm to about 0.7 µm. When the gap d4 between the second column spacer 112 and the second display substrate 200 is less than about 0.5 µm, a sufficient liquid crystal margin cannot be secured, easily causing the above-described AUA defects. On the other hand, when the gap d4 between the second column spacer 112 and the second display substrate 200 is greater than about 0.7 µm, an external force applied to the first column spacer 111 cannot be dispersed, causing the damage to the first column spacer 111.

Figure 8:
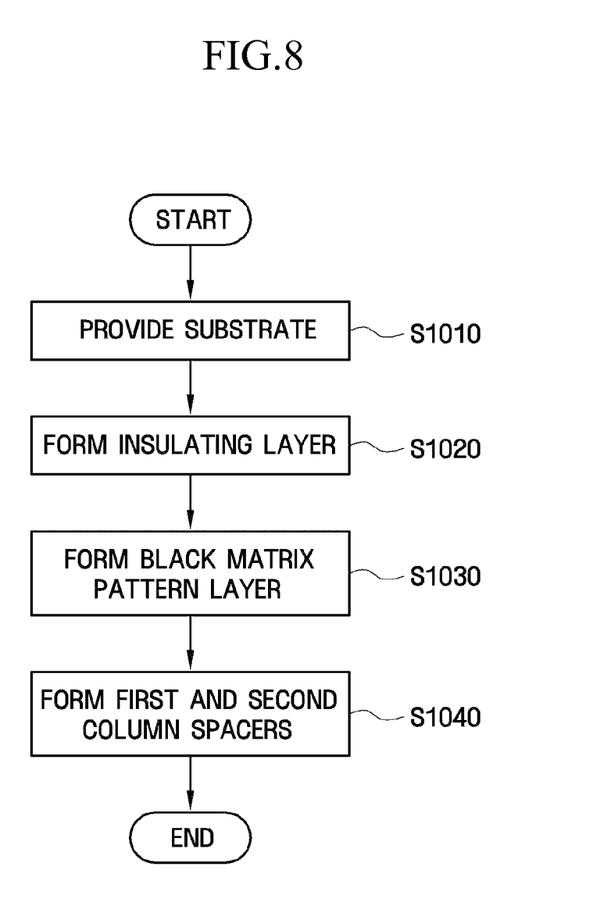
FIG. 8 is a flowchart illustrating an exemplary embodiment of a method of manufacturing a display substrate, according to the invention.
Figure 9A:
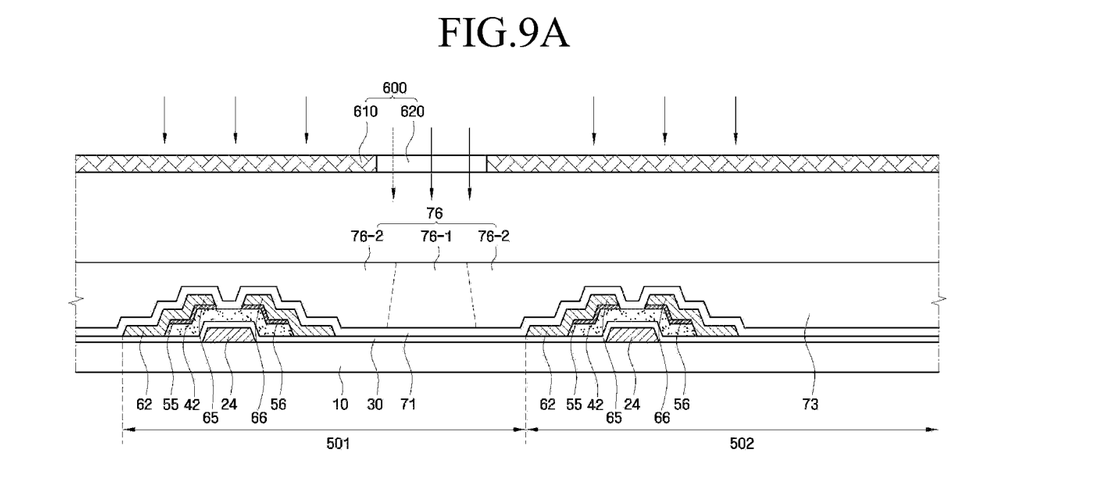
Figure 9B:
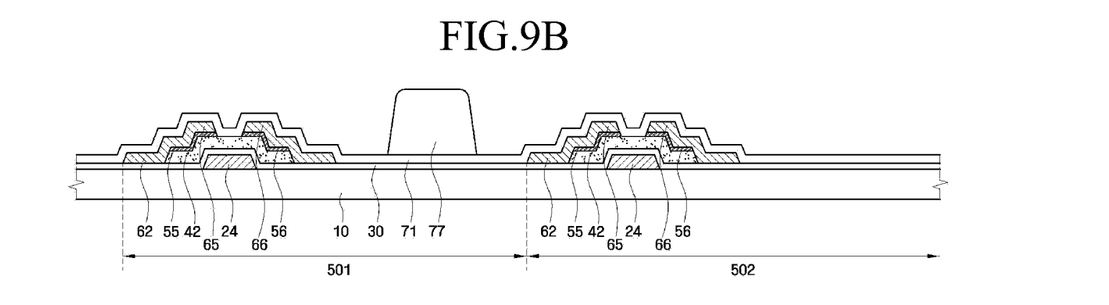
Figure 10:
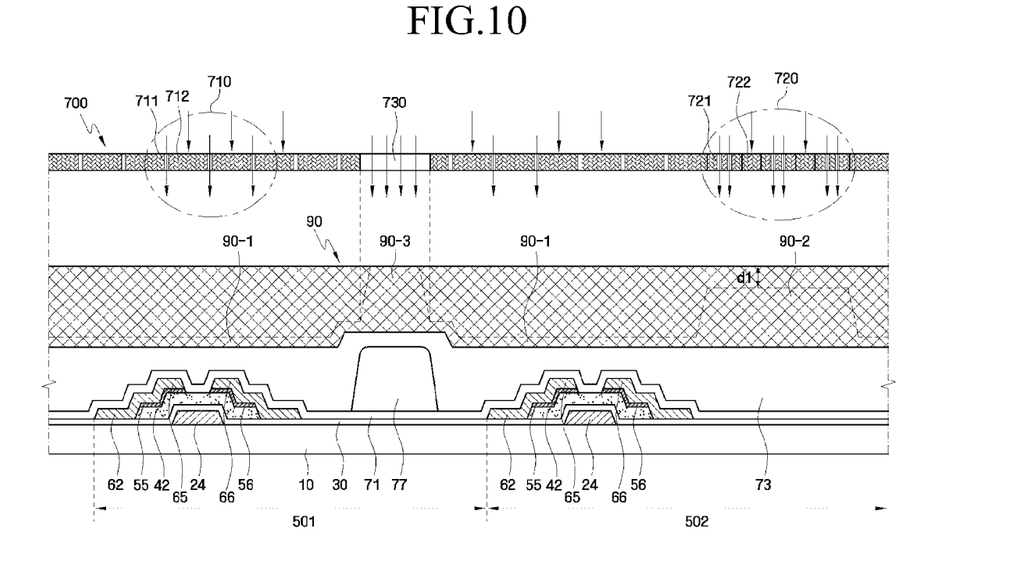

Hereinafter, an exemplary embodiment of a method of manufacturing a display substrate according to the invention will be described with reference to FIGS. 1, 3, and 8 through 10. FIG. 8 is a flowchart illustrating an exemplary embodiment of a method of manufacturing a display substrate according to the invention. FIGS. 9A through 10 are cross-sectional views sequentially illustrating processes included in the method of manufacturing the display substrate according to the invention. For simplicity, elements having the same functions as those illustrated in the drawings of the first exemplary embodiment are indicated by like reference numerals, and thus their description will be omitted or given briefly.

Referring to FIGS. 1, 8 and 9A, a substrate 10 is provided (operation S1010). On the substrate 10, a first pixel area 501 which includes a first light-blocking region 511, and a second pixel area 502 which neighbors (e.g., is directly adjacent to) the first pixel area 501 and includes a second light-blocking region 512, are defined.

Next, a gate wiring (e.g., a gate line 22 and a gate electrode 24), a gate insulating layer 30, a semiconductor layer 42, a data wiring (e.g., a data line 62, source and drain electrodes 65 and 66, and a drain electrode extension portion 67), and a passivation film 71 are sequentially formed on the substrate 10. As a result, a TFT is formed on the substrate 10 in the first and second light-blocking regions 511 and 512.

Referring to FIGS. 9A and 9B, a step pattern 77 is formed on the substrate 10 having the TFT. To this end, a color photoresist layer 76 is formed on the substrate 10 having the TFT. Here, the color photoresist layer 76 may be formed by chemical vapor deposition ("CVD") or spin coating. The color photoresist layer 76 may include a red, green, or blue pigment. In addition, the color photoresist layer 76 may include a negative or positive photoresist.

Next, the color photoresist layer 76 formed on the substrate 10 is exposed to light (indicated by the downward pointing arrows in FIG. 9A) by using a first mask 600 having a blocking portion 610 which blocks light, and an aperture portion 620 through which light can pass. Here, light that passes through the aperture portion 620 of the first mask 600 can reach a region 76-1 of the color photoresist layer 76 but cannot reach a remaining region 76-2 of the color photoresist layer 76. If the color photoresist layer 76 includes a negative photoresist, the region 76-1 of the color photoresist layer 76 where the light reaches may cure, and the remaining region 76-2 of the color photoresist layer 76 where the light does not reach may not cure. After the exposure process, the color photoresist layer 76 is developed. As a result of the development process, the cured region 76-1 of the color photoresist layer 76 is formed into the step pattern 77 (shown as dotted line in FIG. 9A), and the uncured region 76-2 of the color photoresist layer 76 is removed, as illustrated in FIG. 9B. A color filter pattern 75 (see FIG. 2) can be formed at the same time as the step pattern 77 in a first pixel region 521.

Referring to FIG. 10, an insulating layer 73 is formed on the resultant structure of FIG. 9B (operation S1020). The insulating layer 73 may be formed by, e.g., CVD or spin coating. Here, the insulating layer 73 may include, but is not limited to, a negative or positive photoresist.

Next, referring to FIG. 10, a black matrix pattern layer 91, and first and second column spacers 93 and 95 (see FIG. 3) are formed on the insulating layer 73 (operations S1030 and S1040). To this end, a black matrix pattern and column spacer layer 90 is formed on the insulating layer 73. The black matrix pattern and column spacer layer 90 may be formed using CVD or spin coating. The black matrix pattern and column spacer layer 90 may include a black pigment. In addition, the black matrix pattern and column spacer layer 90 may include a negative or positive photoresist. For ease of description, it is understood hereinafter that the black matrix pattern and column spacer layer 90 include a negative photoresist.

Next, the black matrix pattern and column spacer layer 90 is exposed to light (indicated by the downward arrows in FIG. 10) by using a second mask 700 which can adjust the amount of light that passes therethrough during the exposure process. The second mask 700 may include a first mask region 710 that passes a smallest amount of light, a second mask region 720 that passes a greater amount of light than the first mask region 710, and an aperture region 730 that passes a largest amount of light. Here, the first mask region 710 and the second mask region 720 respectively include aperture portions 711 and 721 through which light passes, and blocking portions 712 and 722 through which light cannot pass.

A first region 90-1 of the black matrix pattern and column spacer layer 90 may overlap the gate wiring e.g., the gate line 22 and the gate electrode 24) and the data wiring e.g., the data line 62, the source and drain electrodes 65 and 66, and the drain electrode extension portion 67) in each of the first and second light-blocking regions 511 and 512. A second region 90-2 formed in the second light-blocking region 512 may not overlap the gate wiring and the data wiring in the second light-blocking region 512. A third region 90-3 may overlap the step pattern 77 formed in the first light-blocking region 511. That is, the first region 90-1 is where a black matrix pattern layer 91 is to be formed, the second region 90-2 is where the black matrix pattern layer 91 and the second column spacer 95 are to be formed, and the third region 90-3 is where the black matrix pattern layer 91 and the first column spacer 93 are to be formed.

Light that passes through the first mask region 710 of the second mask 700 is irradiated to the first region 90-1 of the black matrix pattern and column spacer layer 90. In addition, light that passes through the second mask region 720 of the second mask 700 is irradiated to the second region 90-2 of the black matrix pattern and column spacer layer 90. Also, light that passes through the aperture region 730 of the second mask 700 is irradiated to the third region 90-3 of the black matrix pattern and column spacer layer 90.

The third region 90-3 exposed to a largest amount of light may have a highest rate of curing. The curing rate of the second region 90-2 may be lower than that of the third region 90-3. In addition, the first region 90-1 may have a lowest rate of curing. After the exposure process, the black matrix pattern and column spacer layer 90 is developed. The development process may remove a smallest portion of the black matrix pattern and column spacer layer 90 in the third region 90-3, some of the black matrix pattern and column spacer layer 90 in the second region 90-2, and a largest portion of the black matrix pattern and column spacer layer 90 in the first region 90-1. Accordingly, the first region 90-1 is formed into the black matrix pattern layer 91, the second region 90-2 is formed into the black matrix pattern layer 91 and the second column spacer 95, and the third region 90-3 is formed into the black matrix pattern layer 91 and the first column spacer 93, as indicated by the dotted lines in FIG. 10. That is, a display substrate including the first column spacer 93 and the second column spacer 95, which have top surfaces at different heights and have a step difference d1 therebetween as shown in FIG. 3, is formed. Here, the first column spacer 93 and the second column spacer 95 protrude from the black matrix pattern layer 91.

Although not shown in the drawings, if the black matrix pattern and column spacer layer 90 includes a positive photoresist, the third region 90-3 exposed to a largest amount of light may be formed into the black matrix pattern layer 91, the second region 90-2 exposed to a next largest amount of light may be formed into the black matrix pattern layer 91 and the second column spacer 95 protruding therefrom, and the first region 90-1 exposed to a smallest amount of light may be formed into the black matrix pattern layer 91 and the first column spacer 93 protruding therefrom.

Figure 11:
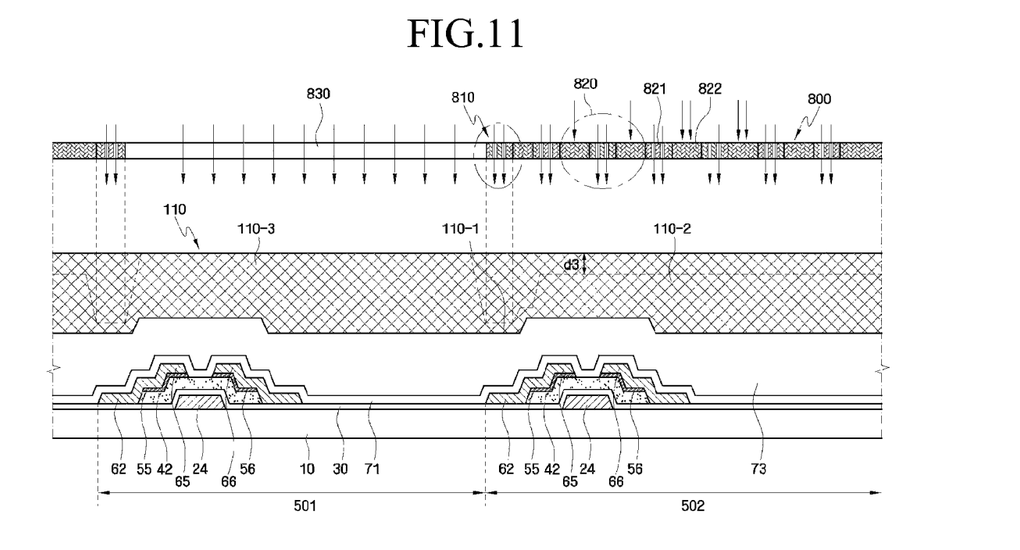
FIG. 11 is a cross-sectional view illustrating another exemplary embodiment of a method of manufacturing a display substrate, according to the invention.

Hereinafter, another exemplary embodiment (hereinafter, referred to as an 'alternative modified embodiment') of the embodiment in FIGS. 9A-10 will be described with reference to FIGS. 4, 5, 8 and 11. FIG. 11 is a cross-sectional view illustrating another exemplary embodiment of a method of manufacturing a display substrate according to the alternative modified embodiment of the invention. For simplicity, elements having the same functions as those illustrated in the drawings of the embodiment of FIGS. 4-6 are indicated by like reference numerals, and thus their description will be omitted or given briefly.

Referring to FIGS. 4, 8 and 11, a substrate 10 is provided (operation S1010). On the substrate 10, a first pixel area 501 which includes a first light-blocking region 511 and a second pixel area 502 which neighbors the first pixel area 501 and includes a second light-blocking region 512 are defined.

Next, a gate wiring (e.g., a gate line 22 and a gate electrode 24), a gate insulating layer 30, a semiconductor layer 42, a data wiring (e.g., a data line 62, source and drain electrodes 65 and 66, and a drain electrode extension portion 67), and a passivation film 71 are sequentially formed on the substrate 10. As a result, a TFT is formed on the substrate 10 in the first and second light-blocking regions 511 and 512.

Referring to FIG. 11, an insulating layer 73 is formed on the resultant substrate 10. The insulating layer 73 may be formed by, e.g., CVD or spin coating. Here, the insulating layer 73 may include, but is not limited to, a negative or positive photoresist.

Next, referring to FIG. 11, a black matrix pattern layer 91, and first and second column spacers 111 and 112 (see FIG. 5) are formed on the insulating layer 73 (operations S1030 and S1040). To this end, a black matrix pattern and column spacer layer 110 is formed on the insulating layer 73. The black matrix pattern and column spacer layer 110 may be formed using CVD or spin coating. The black matrix pattern and column spacer layer 110 may include a black pigment. In addition, the black matrix pattern and column spacer layer 110 may include a negative or positive photoresist. For ease of description, it is understood hereinafter that the black matrix pattern and column spacer layer 110 include a negative photoresist.

Next, the black matrix pattern and column spacer layer 110 is exposed to light (indicated by the downward arrows in FIG. 11) by using a third mask 800 which can adjust the amount of light that passes therethrough during the exposure process. The third mask 800 may include a first mask region 810 that passes a smallest amount of light, a second mask region 820 that passes a greater amount of light than the first mask region 810, and an aperture region 830 that passes a largest amount of light. A first region 110-1 of the black matrix pattern and column spacer layer 110 is overlapped by (e.g., aligned with) the first mask region 810, a second region 110-2 thereof is overlapped by the second mask region 820, and a third region 110-3 thereof is overlapped by the aperture region 830. Here, the first region 110-1 is where a black matrix pattern layer 91 is to be formed, the second region 110-2 is where the black matrix pattern layer 91 and the second column spacer 112 are to be formed, and the third region 110-3 is where the black matrix pattern layer 91 and the first column spacer 111 are to be formed.

The third region 110-3 exposed to a largest amount of light may have a highest rate of curing. The curing rate of the second region 110-2 may be lower than that of the third region 110-3. In addition, the first region 110-1 may have a lowest rate of curing. After the exposure process using the third mask 800, the black matrix pattern and column spacer layer 110 is developed. The development process may remove a smallest portion of the black matrix pattern and column spacer layer 110 in the third region 110-3, some of the black matrix pattern and column spacer layer 110 in the second region 110-2, and a largest portion of the black matrix pattern and column spacer layer 110 in the first region 110-1. Accordingly, the first region 110-1 is formed into the black matrix pattern layer 91, the second region 110-2 is formed into the black matrix pattern layer 91 and the second column spacer 112, and the third region 110-3 is formed into the black matrix pattern layer 91 and the first column spacer 111, as indicated by the dotted lines in FIG. 11. That is, a display substrate including the first column spacer 111 and the second column spacer 112, which have top surfaces at different heights and have a step difference d3 therebetween as shown in FIG. 5, is formed. Here, the first column spacer 111 and the second column spacer 112 protrude from the black matrix pattern layer 91.

Although not shown in the drawings, if the black matrix pattern and column spacer layer 90 includes a positive photoresist, the third region 110-3 exposed to a largest amount of light may be formed into the black matrix pattern layer 91, the second region 110-2 exposed to a next largest amount of light may be formed into the black matrix pattern layer 91 and the second column spacer 112 protruding therefrom, and the first region 110-1 exposed to a smallest amount of light may be formed into the black matrix pattern layer 91 and the first column spacer 111 protruding therefrom.

While the invention has been particularly shown and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of manufacturing a display substrate, the method comprising:
    providing a substrate comprising a first pixel area including a first light-blocking region, and a second pixel area adjacent to the first pixel area and including a second light-blocking region;
    forming an insulating layer in the first and second light-blocking regions;
    forming a light-blocking material layer on the insulating layer, the light-blocking material layer extended across the first and second light-blocking regions; and
    simultaneously forming from the light-blocking material layer extended across the first and second light-blocking regions:
        a black matrix pattern layer extended across the first and second light-blocking regions, on the insulating layer;
        a first column spacer in the first light-blocking region and which protrudes from the black matrix pattern layer extended across the first and second light-blocking regions; and
        a second column spacer in the second light-blocking region and which protrudes from the black matrix pattern layer extended across the first and second light-blocking regions,
        wherein a height of a top surface of the first column spacer is different from a height of a top surface of the second column spacer, the heights taken with respect to the substrate.

2. The method of claim 1, wherein the forming a black matrix pattern layer, a first column spacer, and a second column spacer comprises:
    exposing the light-blocking material layer extended across the first and second light-blocking regions to light by using a mask,
    wherein the mask adjusts an amount of light irradiated to the light-blocking material layer extended across the first and second light-blocking regions.

3. The method of claim 2, wherein the light-blocking material layer extended across the first and second light-blocking regions comprises a first region, a second region and a third region, wherein each of the first through third regions is exposed to a different amount of light by the mask.

4. The method of claim 3, wherein the third region is exposed to a greater amount of light than the second region, and the second region is exposed to a greater amount of light than the first region.

5. The method of claim 4, wherein when the light-blocking material layer extended across the first and second light-blocking regions includes a negative photoresist, the third region is formed into the first column spacer, the second region is formed into the second column spacer, and the first region is formed into the black matrix pattern layer excluding the first and second column spacers.

6. The method of claim 5, wherein when the light-blocking material layer extended across the first and second light-blocking regions includes a positive photoresist, the third region is formed into the black matrix pattern layer excluding the first and second column spacers, the second region is formed into the second column spacer, and the first region is formed into the first column spacer.

7. A method of manufacturing a display substrate, the method comprising:
    providing a substrate comprising a first pixel area including a first light-blocking region, a second pixel area adjacent to the first pixel area and including a second light-blocking region, and a thin film transistor disposed in each of the first and second light-blocking regions;
    forming an insulating layer in the first and second light-blocking regions;
        forming a black matrix pattern layer on the insulating layer;
        forming a first column spacer in the first light-blocking region and which protrudes from the black matrix pattern layer; and
        forming a second column spacer in the second light-blocking region and which protrudes from the black matrix pattern layer,
    wherein
    a height of a top surface of the first column spacer is different from a height of a top surface of the second column spacer, the heights taken with respect to the substrate, and
    the first and second column spacers are disposed non-overlapping with the thin film transistor of the first and second light-blocking regions, respectively.

8. The method of claim 1, wherein the forming a black matrix pattern layer, a first column spacer, and a second column spacer comprises:
    forming a light-blocking material layer on the insulating layer, the light-blocking material layer extended across the first and second light blocking regions;
    exposing the light-blocking material layer extended across the first and second light blocking regions to light by using a mask to simultaneously form the first and second column spacers disposed non-overlapping with the thin film transistor of the first and second light-blocking regions, respectively,
    wherein the mask adjusts an amount of light irradiated to the light-blocking material layer.

\* \* \* \* \*